US012586314B1

(12) United States Patent
Karumuri et al.

(10) Patent No.: US 12,586,314 B1
(45) Date of Patent: Mar. 24, 2026

(54) SYSTEMS FOR GENERATION OF 3D MODELS BASED ON IMAGES OF ITEMS

(71) Applicant: AMAZON TECHNOLOGIES, INC., Seattle, WA (US)

(72) Inventors: Meher Gitika Karumuri, Santa Clara, CA (US); Sunil Sharadchandra Hadap, Dublin, CA (US)

(73) Assignee: AMAZON TECHNOLOGIES, INC., Seattle, WA (US)

( * ) Notice: Subject to any disclaimer, the term of this patent is extended or adjusted under 35 U.S.C. 154(b) by 288 days.

(21) Appl. No.: 18/362,354

(22) Filed: Jul. 31, 2023

(51) Int. Cl.
*G06T 17/10* (2006.01)
*G06F 30/10* (2020.01)
(Continued)

(52) U.S. Cl.
CPC .............. *G06T 17/10* (2013.01); *G06F 30/10* (2020.01); *G06T 7/11* (2017.01); *G06T 7/74* (2017.01);
(Continued)

(58) Field of Classification Search
CPC ... G06T 17/10; G06T 7/11; G06T 7/74; G06T 15/04; G06T 19/00; G06T 2207/20021; G06T 2207/20081; G06T 2207/30196; G06T 2210/12; G06T 2210/16; G06F 30/10
See application file for complete search history.

(56) References Cited

U.S. PATENT DOCUMENTS 11,830,127 B1 * 11/2023 Arbit ....................... G06T 15/04
12,094,133 B2 * 9/2024 Ramanathan .......... G06V 20/44
(Continued)

FOREIGN PATENT DOCUMENTS

CN     115705653 A  *  2/2023  ............. G06V 10/86
JP     2019547805   *  1/2020  ............... G06T 7/11
(Continued)

OTHER PUBLICATIONS

"Blender 3D Software", 18 pgs. Retrieved from the Internet: URL: https://www.blender.org.
(Continued)

*Primary Examiner* — Said Broome
*Assistant Examiner* — Denis Vasiliy Minko
(74) *Attorney, Agent, or Firm* — Lindauer Law, PLLC

(57) ABSTRACT

A three-dimensional model for an item is generated using two-dimensional images of the item. Based on the category of the item, bounding boxes in input images that include portions of the item are determined, and a segmentation algorithm is used to generate masks that include specific pixels that represent portions of the item. The generated masks are used in combination with a constructive solid geometry algorithm to create a three-dimensional model of the item. The model is then used to generate a two-dimensional image with pixels that represent portions of the item, each pixel being mapped to a corresponding pixel of an input image. The color and texture values of the input image are associated with the corresponding pixels in the two-dimensional image, which are used to provide the model with colors and textures of the item. This provides a simulated image of the item as worn by a user.

20 Claims, 6 Drawing Sheets

(51) Int. Cl.
    *G06T 7/11*            (2017.01)
    *G06T 7/73*            (2017.01)
    *G06T 15/04*          (2011.01)
    *G06T 19/00*          (2011.01)
(52) U.S. Cl.
    CPC .............. *G06T 15/04* (2013.01); *G06T 19/00*
        (2013.01); *G06T 2207/20021* (2013.01); *G06T*
        *2207/20081* (2013.01); *G06T 2207/30196*
        (2013.01); *G06T 2210/12* (2013.01); *G06T*
        *2210/16* (2013.01)

(56) References Cited

U.S. PATENT DOCUMENTS

2009/0177454 A1* 7/2009 Bronstein ............... G06T 17/20
     703/11
2020/0312008 A1* 10/2020 Cowburn ............. G06V 30/274
2021/0018608 A1* 1/2021 Charpentier ............ G06T 19/00
2021/0326722 A1* 10/2021 Morin ................. G06F 16/9574
2022/0136860 A1* 5/2022 Dong ................... G06V 10/147
     701/16
2022/0269895 A1* 8/2022 Barkan ............... G06F 18/2113

FOREIGN PATENT DOCUMENTS

KR     20190028349 A  * 3/2019 ........... G06V 10/806
WO   WO-2022271838 A1 * 12/2022 ............ G06V 10/25

OTHER PUBLICATIONS

"ZBrush Pixologic 3D Software", 6 pgs. Retrieved from the Internet: URL: https://pixologic.com/.
"Delaunay triangulation", 9 pgs. https://en.wikipedia.org/wiki/Delaunay_triangulation.
Aberman, et al., "Neural Best-Buddies: Sparse Cross-Domain Correspondence", ACM Transactions on Graphics, Aug. 21, 2018, 14 pgs. Retrieved from the Internet: URL: https://arxiv.org/pdf/1805.04140.pdf.
Alldieck, et al., "Tex2Shape: Detailed Full Human Body Geometry From a Single Image", Sep. 15, 2019, 13 pgs. Retrieved from the Internet: URL: https://arxiv.org/abs/1904.08645.
Chan, et al., "Efficient Geometry-aware 3D Generative Adversarial Networks", Stanford University, Apr. 27, 2022, 27 pgs. Retrieved from the Internet: URL: https://arxiv.org/abs/2112.07945.
Efros, Alexei, "Image Pyramids and Blending", Computational Photography, CMU, Fall 2005, 53 pgs. Retrieved from the Internet: URL: http://graphics.cs.cmu.edu/courses/15-463/2005_fall/www/Lectures/Pyramids.pdf.
Gao, et al., "Get3D: A Generative Model of High Quality 3D Textured Shapes Learned from Images", Sep. 22, 2022, 39 pgs. Retrieved from the Internet: URL: https://arxiv.org/abs/2209.11163.
Goodfellow, et al., "Generative Adversarial Nets", University of Montreal, Department of Information, Jun. 10, 2014, 8 pgs. Retrieved from the Internet: URL: https://arxiv.org/abs/1406.2661.
Jang, et al., "CodeNeRF: Disentangled Neural Radiance Fields for Object Categories", University College London, Department of Computer Science, Sep. 3, 2021, 10 pgs. Retrieved from the Internet: URL: https://arxiv.org/abs/2109.01750.
Johari, et al., "GeoNeRF: Generalizing NeRF with Geometry Priors", Mar. 21, 2022, 19 pgs. Retrieved from the Internet: URL: https://arxiv.org/abs/2111.13539.
Kato, et al., "Neural 3D Mesh Renderer", The University of Texas at Tokyo, Nov. 20, 2017, 17 pgs. Retrieved from the Internet: URL: https://arxiv.org/abs/1711.07566.

Li, et al., "Learning a Model of Facial Shape and Expression from 4D Scans", Nov. 2017, 17 pgs. Retrieved from the Internet: URL: https://ps.is.mpg.de/uploads_file/attachment/attachment/400/paper.pdf.
Lin, et al., "SDF-SRN: Learning Signed Distance 3D Object Reconstruction from Static Images", Carnegie Mellon University, 2020, 12 pgs. Retrieved from the Internet: URL: https://scholar.google.com/scholar?q=sdf-srn:+learning+signed+distance+3d+object+reconstruction+lin&hl=en&as_sdt=0&as_vis=1&oi=scholart.
Long, et al., "NeuralUDF: Learning Unsigned Distance Fields for Multi-view Reconstruction of Surfaces with Arbitrary Topologies", Nov. 25, 2022, 16 pgs. Retrieved from the Internet: URL: https://arxiv.org/abs/2211.14173.
Loper, et al., "SMPL: A Skinned Multi-Person Linear Model", Oct. 16, 2015, 16 pgs. Retrieved from the Internet: URL: https://files.is.tue.mpg.de/black/papers/SMPL2015.pdf.
Mildenhall, et al., "NeRF: Representing Scenes as Neural Radiance Fields for View Synthesis", Aug. 3, 2020, 25 pgs. Retrieved from the Internet: URL: https://arxiv.org/abs/2003.08934.
Moon, et al., "3D Clothed Human Reconstruction in the Wild", Jul. 20, 2022, 25 pgs. Retrieved from the Internet: URL: https://arxiv.org/abs/2207.10053.
Saito, et al., "PIFu: Pixel-Aligned Implicit Function for High-Resolution Clothed Human Digitalization", Dec. 3, 2019, 15 pgs. Retrieved from the Internet: URL: https://arxiv.org/abs/1905.05172.
Saito, et al., "PIFuHD: Multi-Level Pixel-Aligned Implicit Function for High-Resolution 3D Human Digitalization", Apr. 1, 2020, 10 pgs. Retrieved from the Internet: URL: https://arxiv.org/abs/2004.00452.
Shu, et al., "Portrait Lighting Transfer Using a Mass Transport Approach", Oct. 2017, 6 pgs. Retrieved from the Internet: URL: https://www3.cs.stonybrook.edu/~cvl/content/papers/2017/shu_tog2017.pdf.
Skorokhodov, et al., "EpiGRAF: Rethinking Training of 3D GANs", Dec. 15, 2022, 23 pgs. Retrieved from the Internet: URL: https://arxiv.org/abs/2206.10535.
Smigel, Mason, "Deformation Cage" 8 pgs. Retrieved from the Internet: URL: https://www.masonsmigel.com/post/deformation-cage.
Sorkine, et al., "As-Rigid-As-Possible Surface Modeling", TU Berlin, Germany, 2007, 8 pgs. Retrieved from the Internet: URL: https://igl.ethz.ch/projects/ARAP/arap_web.pdf.
Stutz, David, "A Formal Definition of Watertight Meshes", Jan. 2018. 11 pgs. Retrieved from the Internet: URL: https://davidstutz.de/a-formal-definition-of-watertight-meshes/.
Tewari, et al., "Advances in Neural Rendering", Mar. 30, 2022, 33 pgs. Retrieved from the Internet: URL: https://arxiv.org/abs/2111.05849.
Wang, et al., "Eyeglasses 3D Shape Reconstruction from a Single Face Image", 2020, 16 pgs. Retrieved from the Internet: URL: http://xufeng.site/publications/2020/wyt_Eyeglasses%203D%20shape%20reconstruction%20from%20a%20single%20face%20image.pdf.
Wimbauer, et al., "De-rendering 3D Objects in the Wild", Sep. 27, 2022, 15 pgs. Retrieved from the Internet: URL: https://arxiv.org/abs/2201.02279.
Xu, et al., "3D Human Texture Estimation from a Single Image with Transformers", Nanyang Technological University, S-Lab, 2021, 10 pgs. Retrieved from the Internet: URL: https://scholar.google.com/scholar?q=3d+human+texture+estimation+from+a+single+image+with+transformers+xu&hl=en&as_sdt=0&as_vis=1&oi=scholart.
Yu, et al., "pixelNeRF: Neural Radiance Fields from One or Few Images", UC Berkeley, May 30, 2021, 20 pgs. Retrieved from the Internet: URL: https://arxiv.org/abs/2012.02190.
Zheng, et al., "DeepHuman: 3D Reconstruction From a Single Image", 2019, 11 pgs. Retrieved from the Internet: URL: https://scholar.google.com/scholar?q=deephuman:+3d+human+reconstruction+from+a+single+image+zheng&hl=en&as_sdt=0&as_vis=1&oi=scholart.

* cited by examiner

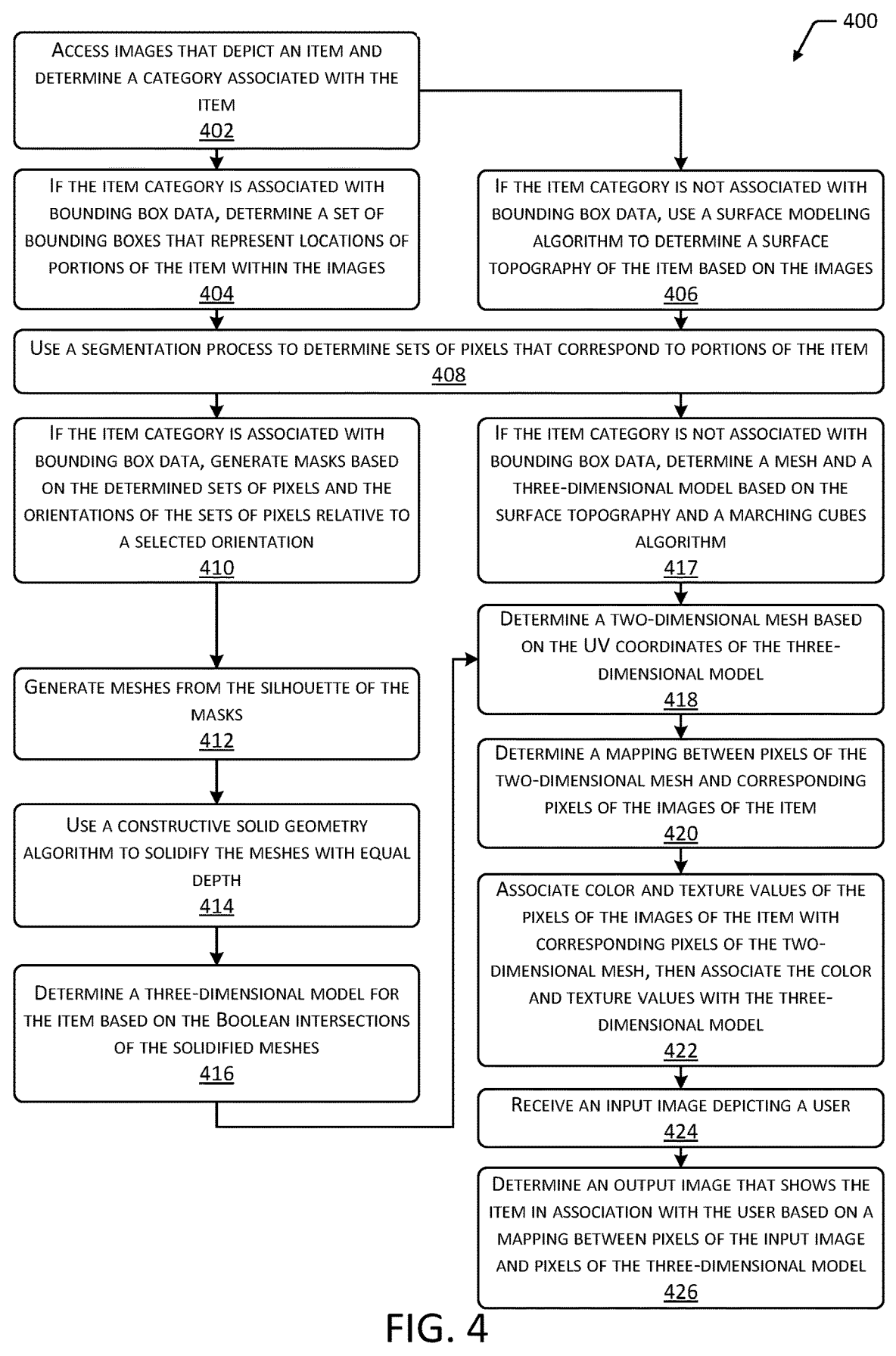

400

ACCESS IMAGES THAT DEPICT AN ITEM AND DETERMINE A CATEGORY ASSOCIATED WITH THE ITEM
402

IF THE ITEM CATEGORY IS ASSOCIATED WITH BOUNDING BOX DATA, DETERMINE A SET OF BOUNDING BOXES THAT REPRESENT LOCATIONS OF PORTIONS OF THE ITEM WITHIN THE IMAGES
404

IF THE ITEM CATEGORY IS NOT ASSOCIATED WITH BOUNDING BOX DATA, USE A SURFACE MODELING ALGORITHM TO DETERMINE A SURFACE TOPOGRAPHY OF THE ITEM BASED ON THE IMAGES
406

USE A SEGMENTATION PROCESS TO DETERMINE SETS OF PIXELS THAT CORRESPOND TO PORTIONS OF THE ITEM
408

IF THE ITEM CATEGORY IS ASSOCIATED WITH BOUNDING BOX DATA, GENERATE MASKS BASED ON THE DETERMINED SETS OF PIXELS AND THE ORIENTATIONS OF THE SETS OF PIXELS RELATIVE TO A SELECTED ORIENTATION
410

IF THE ITEM CATEGORY IS NOT ASSOCIATED WITH BOUNDING BOX DATA, DETERMINE A MESH AND A THREE-DIMENSIONAL MODEL BASED ON THE SURFACE TOPOGRAPHY AND A MARCHING CUBES ALGORITHM
417

DETERMINE A TWO-DIMENSIONAL MESH BASED ON THE UV COORDINATES OF THE THREE-DIMENSIONAL MODEL
418

GENERATE MESHES FROM THE SILHOUETTE OF THE MASKS
412

DETERMINE A MAPPING BETWEEN PIXELS OF THE TWO-DIMENSIONAL MESH AND CORRESPONDING PIXELS OF THE IMAGES OF THE ITEM
420

USE A CONSTRUCTIVE SOLID GEOMETRY ALGORITHM TO SOLIDIFY THE MESHES WITH EQUAL DEPTH
414

ASSOCIATE COLOR AND TEXTURE VALUES OF THE PIXELS OF THE IMAGES OF THE ITEM WITH CORRESPONDING PIXELS OF THE TWO-DIMENSIONAL MESH, THEN ASSOCIATE THE COLOR AND TEXTURE VALUES WITH THE THREE-DIMENSIONAL MODEL
422

DETERMINE A THREE-DIMENSIONAL MODEL FOR THE ITEM BASED ON THE BOOLEAN INTERSECTIONS OF THE SOLIDIFIED MESHES
416

RECEIVE AN INPUT IMAGE DEPICTING A USER
424

DETERMINE AN OUTPUT IMAGE THAT SHOWS THE ITEM IN ASSOCIATION WITH THE USER BASED ON A MAPPING BETWEEN PIXELS OF THE INPUT IMAGE AND PIXELS OF THE THREE-DIMENSIONAL MODEL
426

FIG. 4

SYSTEMS FOR GENERATION OF 3D MODELS BASED ON IMAGES OF ITEMS

BACKGROUND

Some online stores, and other types of interfaces, may represent an item using a three-dimensional model, which may enable users to examine different portions of the item and in some cases depict the item in association with a user's body, such as being worn. However, a limited number of items are represented using three-dimensional models, and generation of such models may require a significant investment of time and computational resources, human intervention, and may be subject to inaccuracies.

BRIEF DESCRIPTION OF FIGURES

The detailed description is set forth with reference to the accompanying figures. In the figures, the left-most digit(s) of a reference number identifies the figure in which the reference number first appears. The use of the same reference numbers in different figures indicates similar or identical items or features.

FIG. 4 is a flow diagram depicting an implementation of a method for determining a three-dimensional model that represents an item based on images of the item and using the model to determine an output image based on an input image representing a user or other individual.

Figure 1A:
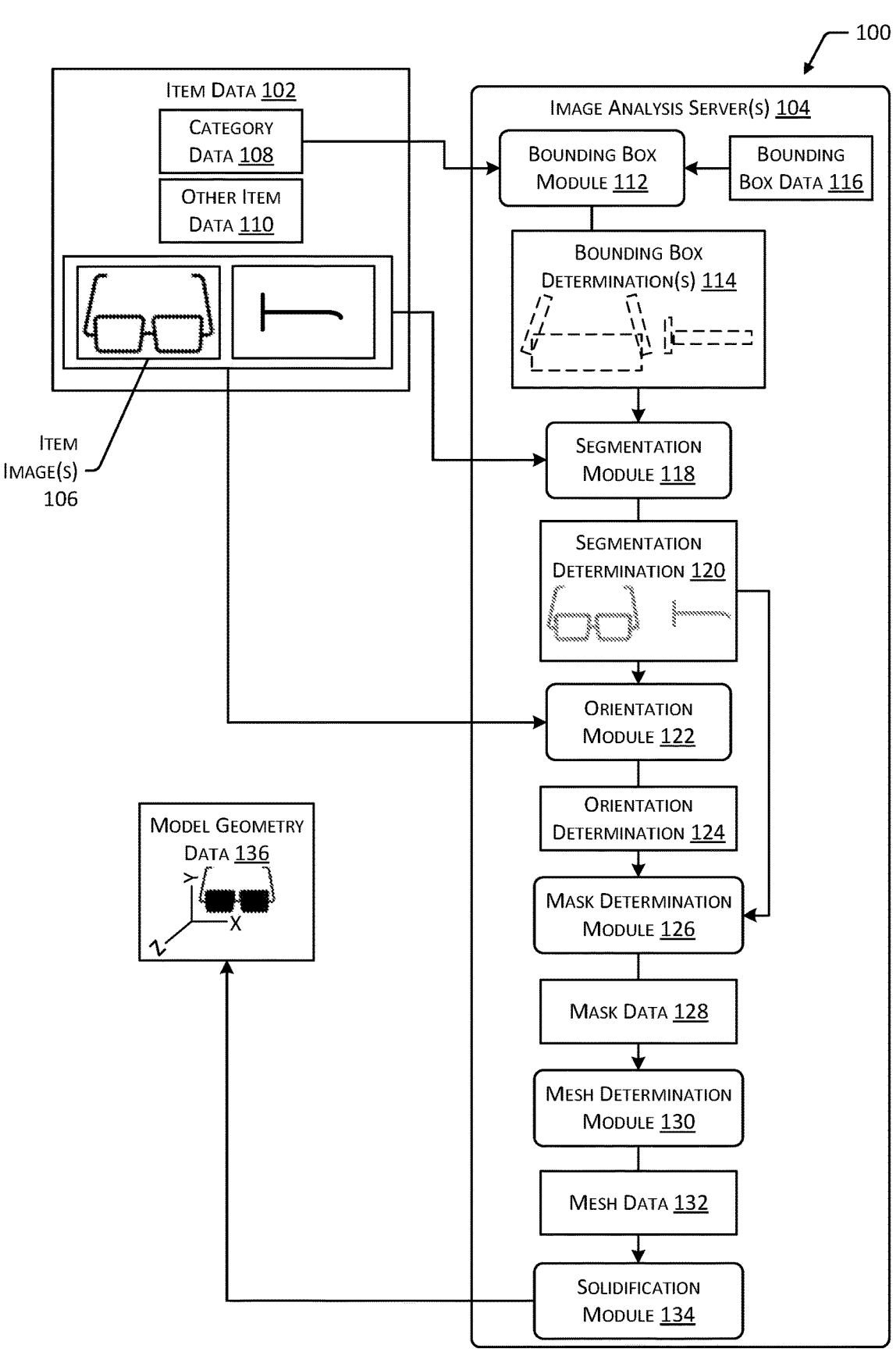
FIG. 1A is a diagram depicting a first portion of an implementation of a system for determining a three-dimensional model that represents an item based on one or more images of the item.

While implementations are described in this disclosure by way of example, those skilled in the art will recognize that the implementations are not limited to the examples or figures described. It should be understood that the figures and detailed description thereto are not intended to limit implementations to the particular form disclosed but, on the contrary, the intention is to cover all modifications, equivalents, and alternatives falling within the spirit and scope as defined by the appended claims. The headings used in this disclosure are for organizational purposes only and are not meant to be used to limit the scope of the description or the claims. As used throughout this application, the word "may" is used in a permissive sense (i.e., meaning having the potential to) rather than the mandatory sense (i.e., meaning must). Similarly, the words "include", "including", and "includes" mean "including, but not limited to".

DETAILED DESCRIPTION

An online store may offer various items for purchase and may present information associated with the items, such as text descriptions, images, and so forth. In some cases, an online store may represent an item using a three-dimensional (3D) model. A 3D model may enable users to examine different portions of the item, such as by manipulating the model (e.g., rotate, pan, zoom, tilt) to examine the model representing the item from different viewpoints and orientations. Some online stores may offer augmented reality (AR) or virtual-try-on (VTO) functionality, in which a user may provide an image of the user, or another individual, and the 3D model and the image may be used to generate an output image that shows the 3D model in association with the user or other individual, such as by depicting the user wearing the item. Use of a 3D model for this process, compared to a VTO process that uses a two-dimensional image, allows a larger number of poses and viewpoints to be presented, may account for lighting and other environmental effects, and may provide for improved user engagement. While providing this functionality may increase the likelihood that items are purchased, decrease the likelihood that items are returned, and improve user engagement and the overall user experience, 3D models are typically available for only a limited portion of items. Generation of a 3D model may require significant time and expense in the form of human labor and computational resources, and may be subject to inaccuracy.

Described in this disclosure are techniques for generating a 3D model that represents an item, based on one or more two-dimensional (2D) images of the item, automatically, without requiring human intervention. A 2D image of an item may include images provided by a seller or manufacturer of the item, or from other sources, that depict the item from various orientations. For example, an online store may store or access data representing a catalog of items available for purchase, which may include images of one or more of the items. Continuing the example, a first image of an item may depict the item from a first orientation or viewpoint, while a second image of the item may depict the item from a second orientation or viewpoint from which one or more other portions of the item are visible. In some implementations, different images of items may depict different variations of an item from various orientations or viewpoints, such as items having the same general shape, but that have different colors, textures, or other visible features. Use of multiple images that depict an item from different orientations or viewpoints may enable a 3D model to be generated that enables the item to be viewed from a larger number of orientations.

For a set of images that depict an item, the portions of the images (e.g., sets of pixels) that represent the item are first determined. In some implementations, a set of bounding boxes or other regions within an image that are likely to include a portion of the depicted item may be determined. For example, based on category data that indicates a category associated with the item or the image(s), bounding box data may indicate a set of bounding boxes that correspond to the category. Continuing the example, an item category may include eyeglasses, which typically include a front frame with lenses, and two temples that extend generally perpendicular to the front frame when worn. For items that are associated with the eyeglasses category, the bounding box data may indicate a corresponding set of bounding boxes that include three rectangular regions, arranged generally perpendicular to one another, that represent portions of the item. Characteristics of pixels in the image(s) may be used to determine a location of the set of bounding boxes that is most likely to represent the location of the item within the image(s). A segmentation algorithm may be used, for each bounding box or for the entire image, to determine sets of pixels that correspond to portions of the item, based on characteristics of the pixels, such as colors or textures of the pixels. For example, by determining a label for each pixel in a bounding box, a segmentation algorithm may determine sets of pixels that are likely to correspond to the same object or background, where edges or boundaries of objects are located, and so forth. In some implementations, a surface normal algorithm may be used to determine an orientation associated with one or more of the images relative to a selected normal orientation. For example, the location of a set of pixels within an image and the perspective transform of the image relative to a selected normal view such as front, side, top, bottom, or rear, may enable generation of a portion of a mask that represents a location of a portion of the item.

Continuing the example, each set of pixels that is determined to represent a portion of the item may be frontalized (e.g., changed to a selected normal orientation, such as a front-facing or other orthogonal orientation) and used to generate a mask having the selected orientation. Each mask may be used to generate a two-dimensional (e.g., planar) mesh, such as through use of a Delaunay triangulation algorithm. The meshes may then be solidified, such as through use of a constructive solid geometry (CSG) algorithm, and a 3D model may be determined based on the Boolean intersection(s), or other relationships, of the combination of meshes.

The 3D model may be used to generate output that is presented to users. For example, a 3D model that depicts an item may be presented in association with a webpage or other interface that includes information regarding the item, and user input may be used to manipulate the 3D model, such as by rotating, zooming, or otherwise causing a change in orientation or viewpoint to enable viewing of different portions of the item. In some implementations, an input image that depicts a user may be received, and a set of pixels in the image that represent a particular portion of the body of the user may be determined. A mapping between a portion of the model and the set of pixels that represent the portion of the body may be determined and used to generate an output image that depicts the item in association with the user. For example, in response to an image of the face of a user, locations of the eyes, nose, and ears of the user within the image may be determined and used to position portions of the 3D model that correspond to the lenses, nose bridge, and temples of a pair of eyeglasses, so that the 3D model representing the item is shown in conjunction with the image of the user to simulate the appearance of the user wearing the eyeglasses.

In some implementations, if the category associated with the item or the image(s) of the item is a type of category associated with an irregular shape or geometry, such as footwear or a clothing item, a surface modeling algorithm may be used to determine a surface topology associated with the item in addition to or in place of using bounding box data. For example, an irregularly-shaped surface of an object may be determined using implicit functions such as signed distance fields (SDF), unsigned distance fields (UDF), occupancy fields, point clouds, and so forth.

In some implementations, a determined 3D model that represents an item may be associated with color values or texture values that correspond to the colors and textures presented in the initial images of the item. For example, after determining the 3D model, a two-dimensional image or mesh may be generated, such as by using the vertices of the model as the UV coordinates of the mesh, that represent the UV/texture space of the 3D model. For example, the UV coordinates associated with a 3D model may include two-dimensional texture coordinates that correspond to the vertices of the surface mesh for the 3D model. Continuing the example, each UV coordinate corresponds to a respective vertex of the 3D mesh, and a UV mesh for a 3D model may be created through a process of UV mapping, in which the UV representation of the 3D object is mapped to corresponding coordinates by conceptually unfolding and flattening the 3D model. Additionally, a mapping between the pixels in the two-dimensional image and the pixels of the original image(s) of the item may be determined, and color and texture values associated with the pixels of the original image(s) may be associated with corresponding pixels of the image determined based on the 3D model. For example, a mapping may be determined based on the pose of an image of the item relative to the 3D model, which may be used to determine the two-dimensional mesh based on the 3D model, using vertices as the UV coordinates of the mesh to be textured as a projection of the mesh vertices for the original image of the item. The color and texture values may then be associated with the 3D model, enabling the 3D model to have colors and textures that correspond to the depicted item when presented to a user. Sets of pixels determined using the segmentation algorithm may also be used when associating colors and textures with pixels. For example, pixels that represent the lenses of a pair of glasses may be determined based on segmentation data, then corresponding portions of the 3D model may be made transparent. For other types of items, the transparency of other portions of the item may be controlled in a similar manner.

Implementations described herein may therefore enable a 3D model that represents an item to be generated using two-dimensional images of the item, without requiring human intervention. Use of bounding box data or a surface modeling algorithm based on the category of the item may enable regions of the images that include portions of the item to be determined. Sets of pixels that represent the item may then be determined through use of segmentation algorithms or other methods, which may be used to generate masks that represent portions of the item. The masks may be used to generate planar meshes for each portion of the item, which may be solidified, such as through use of a CSG algorithm, then the 3D model may be determined based on the Boolean intersection(s) of the solidified meshes. The UV/texture space (a two-dimensional mesh) of the 3D model may be determined, and used to associate colors and textures from the original images of the item to corresponding pixels of the 3D model by determining a mapping between the two-dimensional mesh and corresponding pixels of the original image(s) of the item.

FIG. 1A is a diagram 100 depicting an implementation of a first portion of a system for determining a three-dimensional model that represents an item based on one or more images of the item. Item data 102 associated with an item may be provided to or stored in association with one or more image analysis servers 104, which may be used to process images or other portions of the item data 102 to generate a three-dimensional (3D) model. While FIG. 1A depicts a single element representing the image analysis server(s) 104, the image analysis server(s) 104 may include any number and any type of computing device(s), including without limitation personal computing devices, portable computing devices, servers, wearable computing devices, vehicle-based computing devices, networked media devices, and so forth. In some implementations, the item data 102 may be stored in data storage associated with or accessible to the image analysis server(s) 104. In other implementations, the item data 102 may be provided to the image analysis server(s) 104 by another computing device, such as a device associated with a seller or manufacturer of an item represented by the item data 102. Analysis of the item data 102, as described with regard to FIG. 1A, may be performed by the image analysis server(s) 104 automatically, or in response to an event such as receipt of the item data 102 or receipt of a request to generate a 3D model based on the item data 102.

The item data 102 may include one or more item images 106 that depict the item represented by the item data 102. For example, each item image 106 may depict the item from a particular orientation or viewpoint, such that different portions of the item are visible in each item image 106. In some cases, different item images 106 may depict different variations of the represented item. For example, a first item image 106 may depict the represented item having a first color, while the second item image 106 may depict the represented item having a second color, while other aspects of the depicted item are generally identical between the first item image 106 and second item image 106. The item data 102 may also include other data associated with the represented item, such as category data 108 indicative of a type, category, sub-category, or classification of the represented item. For example, FIG. 1A depicts the item as a pair of eyeglasses, and the category data 108 may indicate a category of "eyewear". Other item data 110 may include a text description of the represented item, dimensions of the item, a price, brand, or manufacturer of the item, and so forth. For example, in some cases the manner in which the item data 102 is analyzed or processed may be determined based in part on the presence of selected keywords within the other item data 110, or items associated with certain manufacturers or with prices that exceed a threshold price may be processed differently than other items.

A bounding box module 112 associated with the image analysis server(s) 104 may generate bounding box determinations 114 indicative of bounding boxes or other regions of the item images 106 that are likely to include the depicted item. For example, an item image 106 may depict the represented item at a particular orientation or viewpoint, but may also include a background, other objects, and so forth. As such, only certain portions of the item image(s) 106 may depict the item, and certain types of analysis of other portions of the item image(s) 106 using various algorithms may cause inaccuracies. The bounding box module 112 may access bounding box data 116 that associates the category of the item, indicated in the category data 108, with one or more bounding box determinations 114. For example, a pair of eyeglasses would typically have a front frame with lenses and a nose bridge, and two temples that extend generally perpendicularly to the front frame. The bounding box data 116 may therefore associate the item category of "eyewear" with a set of bounding boxes that include three, generally rectangular regions of an image, that are generally perpendicular to one another. For example, a first bounding box may represent a probable location of a front frame within an item image 106, while second and third bounding boxes that extend perpendicular to opposite ends of the first bounding box may represent probable locations of temples within the item image 106. The bounding box module 112 may include one or more machine learning algorithms trained to determine a set of bounding boxes that correspond to the characteristics of pixels in an item image 106, such that the bounding box determination 114 for that item image 106 indicates a number and placement of bounding boxes that each contain a portion of the represented item. In other implementations, the bounding box data 116 may associate other categories of items with different bounding box determinations 114. In other implementations, if no bounding box determination 114 for a particular category is determined, other types of image analysis, such as use of a surface modeling algorithm to determine surface topography or other features of an item depicted in the item image(s) 106 may be used. In still other implementations, if no bounding box determination 114 for a particular category is determined, the determination of bounding boxes may be omitted and the item images 106 may be processed using segmentation algorithms and other algorithms without identifying particular regions of the item images 106. In other implementations, a separate module associated with the image analysis server(s) 104 may cause processing of the item image(s) 106 using a surface modeling algorithm to be performed in response to determining a particular category based on the category data 108, such as a clothing or footwear category which may have an irregular shape.

A segmentation module 118 associated with the image analysis server(s) 104 may generate a segmentation determination 120 based on characteristics of pixels within the bounding boxes indicated in the bounding box determination(s) 114. For example, the segmentation determination 120 may indicate one or more sets of pixels that are likely to be associated with the same portion of the item represented in the item image(s) 106. For example, the segmentation module 118 may include one or more computer vision algorithms or one or more machine learning networks trained to partition an item image 106 into multiple regions or objects (e.g., sets of pixels) that correspond to particular objects, backgrounds, and so forth. Continuing the example, based on the color, intensity, texture, or other characteristics of particular pixels, edges and boundaries of objects may be determined. In some implementations, the segmentation module 118 may determine a label for each pixel within a bounding box based on characteristics of the pixels, and pixels having the same labels or labels that represent characteristics within a threshold value of one another may be classified within the same segment.

An orientation module 122 associated with the image analysis servers(s) 104 may generate one or more orientation determinations 124 indicative of an orientation, point of view, or pose of a set of pixels represented by the segmentation determination 120 relative to a selected orientation (e.g., a normal orientation). For example, the orientation module 122 may include one or more machine learning systems trained to generate a surface normal estimation to predict the surface orientation of objects present in an item image 106 based on characteristics of the pixels of the image and the segmentation determination 120. The orientation or viewpoint associated with an item image 106 may be used when generating a mask based on a set of pixels determined by the segmentation module 118. For example, a mask may be provided with a selected orientation, such as front, side, or top, and a difference in orientation or viewpoint between a set of pixels determined based on the item image 106 and the selected orientation may be used to generate a mask based on the segmentation determination 120.

A mask determination module 126 associated with the image analysis server(s) 104 may determine mask data 128 based on the segmentation determination(s) 120, the orientation determination 214, and in some implementations based on the item images 106 or bounding box determinations 114. In some implementations, a mask may be generated for each bounding box associated with a bounding box determination 114. In some cases, masks may be provided with a selected orientation, such as frontal, side, and top. Masks may be used to determine the boundaries of items or portions of an item within the item image 106. In some implementations, a mask may be represented as a convolution matrix that may be used for edge detection or other operations associated with an item image 106.

A mesh determination module 130 associated with the image analysis server(s) 104 may determine mesh data 132 based on the masks represented by the mask data 128. For example, the mask data 128 shown in FIG. 1A may represent three masks, each mask corresponding to a portion of the depicted item associated with a respective bounding box. A mesh may be generated from the silhouette of a mask, such as through use of Delaunay triangulation or another technique. For example, Delaunay triangulation determines, for a given set of points, a set of triangles that maximizes the minimum of all angles of the triangles when no point of the set of points is inside the circumcircle of any triangle.

A solidification module 134 associated with the image analysis server(s) 104 may use a constructive solid geometry (CSG) algorithm or other technique to add depth to the planar meshes represented by the mesh data 132, then determine model geometry data 136 based on the solidified meshes. For example, the CSG algorithm may be used to add an equal amount of depth to each mesh, then the solidification module 134 may determine the Boolean intersections of the combination of the solidified meshes to determine the model geometry data 136. The model geometry data 136 may include a three-dimensional model that represents the determined shape of the item depicted in the item image(s) 106. Continuing the example, a CSG algorithm may be used to convert the planar meshes represented by the mesh data 132 into geometric primitives. The combination of these primitives may result in certain portions of the primitives overlapping (e.g., a Boolean intersection), which may be used to determine the model geometry data 136.

Figure 1B:
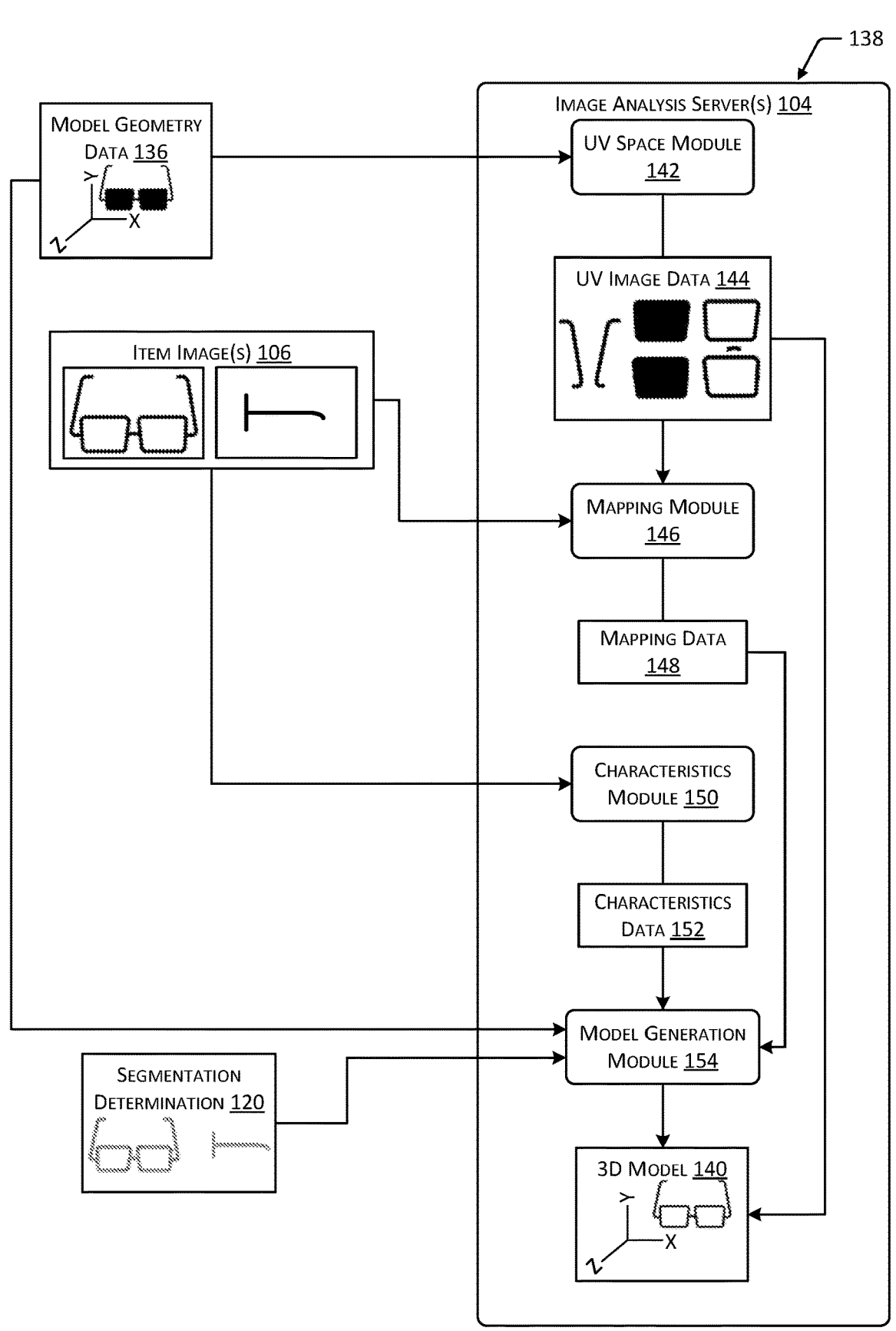
FIG. 1B is a diagram depicting a second portion the system of FIG. 1A for determining a three-dimensional model that represents an item based on one or more images of the item.

FIG. 1B is a diagram 138 depicting a second portion the system of FIG. 1A for determining a three-dimensional model 140 that represents an item based on one or more images of the item. As described with regard to FIG. 1A, model geometry data 136 that represents the shape of an item may be determined based on one or more item images 106 that depict the item. For example, bounding boxes that are likely to include a portion of the item may be processed using a segmentation network to determine sets of pixels that correspond to locations of the item within the item image(s) 106, and one or more masks may be determined based on the sets of pixels and the determined orientation of the pixels. Planar meshes may be determined based on the masks, and a constructive solid geometry (CSG) algorithm may determine primitive solids by adding depth to each of the masks. Then, the model geometry data 136 representing the shape of the item may be determined based on Boolean intersections of the primitive solids.

As shown in FIG. 1B, a UV space module 142 associated with the image analysis server(s) 104 may determine a two-dimensional image that represents the UV or texture space of the model geometry data 136. For example, the UV space module 142 may determine UV image data 144, which may include a two-dimensional mesh or image that represents the parts of the item represented by the model geometry data 136. Continuing the example, each pixel that corresponds to a portion of the item in the UV Image data 144 may map to a corresponding pixel of the model geometry data 136.

A mapping module 146 associated with the image analysis server(s) 104 may determine mapping data 148 that represents a mapping between pixels of the UV image data 144 and corresponding pixels of the item images 106. For example, the mapping module 146 may determine the orientation associated with an item image 106 relative to an orientation of the model geometry data 136, such that a correspondence between portions of the UV image data 144 and portions of the item images 106 may be determined. In some implementations, the UV image data 144 may be generated based in part on the determined orientation. For example, the UV coordinates of the UV image data 144 may be determined based on the model geometry data 136, while faces of the UV image data 144 may be textured or colored based on corresponding texture or color characteristics of the item image(s) 106 after aligning the vertices of the item image(s) 106 with those of the UV image data 144.

For example, a characteristics module 150 associated with the image analysis server(s) 104 may determine characteristics data 152 based on the item image(s) 106. The characteristics data 152 may represent characteristics of one or more pixels of the item image(s) 106, such as color values, texture values, or other visible characteristics of the pixels.

Based on the mapping data 148 and the characteristics data 152, a model generation module 154 associated with the image analysis server(s) 104 may generate the 3D model 140. The 3D model 140 may include geometry determined based on the model geometry data 136, and the pixels of the 3D model 140 may be associated with color or texture values based on the characteristics data 152 representing pixel characteristics of the item images 106, and mapping data 148 that associates pixels of the item image(s) 106 with corresponding pixels of the UV image data 144. For example, colors and textures of the item image(s) 106 may be projected to corresponding pixels of the UV image data 144, which may in turn be used to provide the 3D model 140 with colors and textures of the item image(s) 106. In some implementations, the segmentation determination 120 may indicate pixels that are associated with particular portions of a depicted item. For example, based on the segmentation determination 120, the model generation module 154 may determine the pixels that correspond to the lenses of a pair of glasses, and may cause the corresponding pixels of the 3D model 140 to be transparent. Use of a UV image to associate colors, textures, or other pixel characteristics with the 3D model 140 enables pixel characteristics to be projected on all portions of the 3D model 140 at a small computational cost compared to other methods for determining a color or texture to associate with a model.

Figure 2:
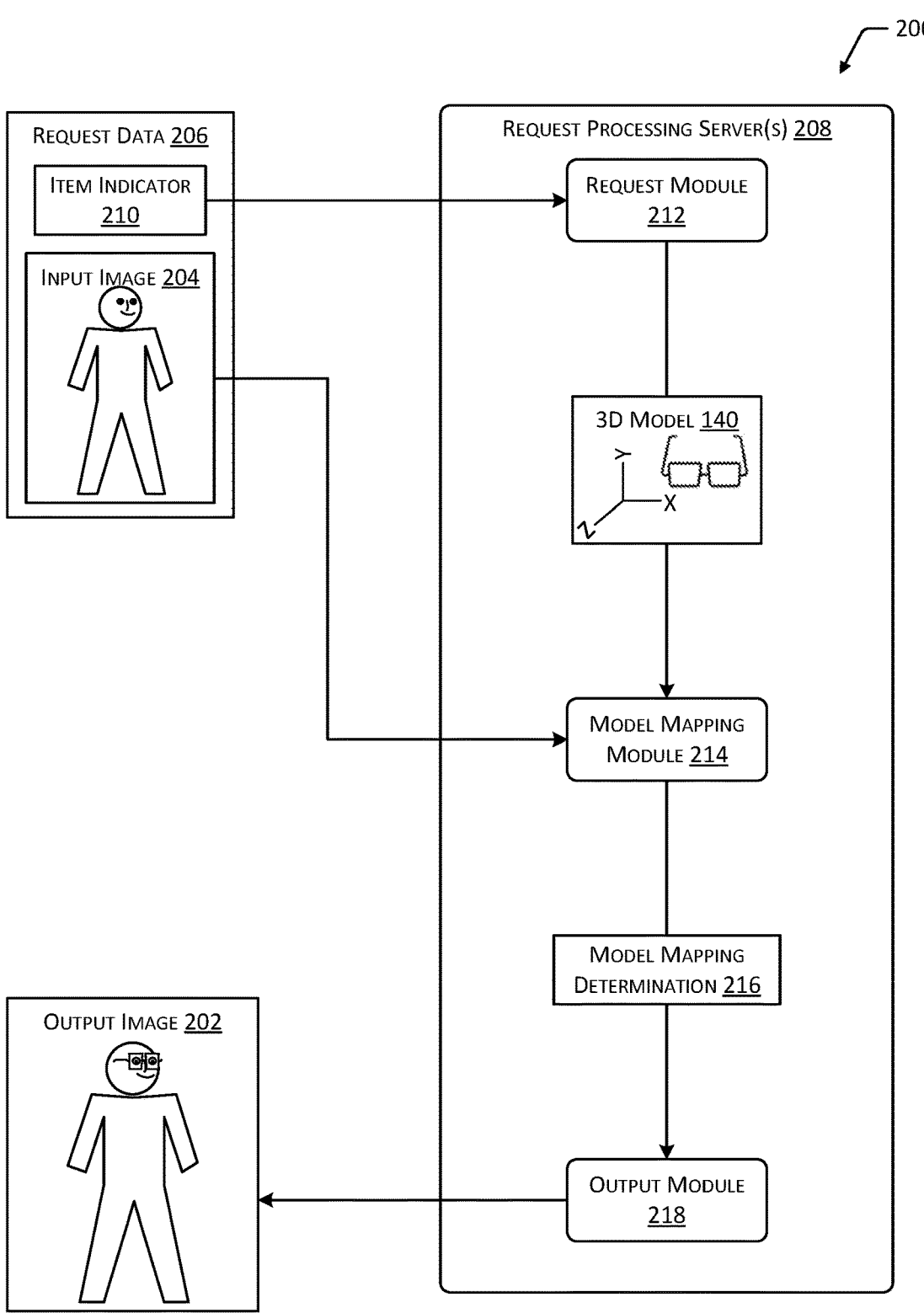
FIG. 2 is a diagram depicting an implementation of a system for determining an output image based on an input image representing a user or other individual and a three-dimensional model representing an item.

FIG. 2 is a diagram 200 depicting an implementation of a system for determining an output image 202 based on an input image 204 representing a user or other individual and a three-dimensional model 140 representing an item. As described with regard to FIGS. 1A and 1B, a 3D model 140 that represents an item may be determined based on item images 106 that depict the item. For example, segmentation networks may be used to determine sets of pixels within the item images 106 that are likely to represent portions of the item, masks may be determined based on the sets of pixels, meshes may be determined based on the masks, and a CSG algorithm may be used to solidify the masks, after which Boolean relationships between the resulting solids may be used to determine model geometry data 136 representing the 3D shape of the item. The color and texture characteristics of the item images 106 may then be mapped to corresponding pixels of the UV image space for the model geometry data 136 to associate color and texture values with the pixels of the UV image data 144 for the 3D model 140, enabling the 3D model 140 to be provided with colors and textures that correspond to the item image(s) 106.

After the 3D model 140 has been determined, as shown in FIG. 2, the 3D model 140 may be used, in combination with an input image 204, to determine an output image 202 that depicts the item in association with a user. For example, request data 206 may be received from a user device or another computing device accessing an online store or other interface associated with one or more request processing servers 208. The request processing server(s) 208 may include any number or any type of computing devices including, without limitation, the types of computing devices described with regard to the image analysis server(s) 104. While FIG. 2 depicts the request processing server(s) 208 receiving the request data 206, in other implementations, the image analysis server(s) 104 may perform the functions described herein with regard to the request processing server(s) 208, and use of separate computing devices to receive request data 206 may be omitted.

The request data 206 may include an item indicator 210 indicative of an item or a webpage or other interface associated with an item. Based on the item indicator 210, a request module 212 associated with the request processing server(s) 208 may determine the 3D model 140 associated with the item that corresponds to the item indicator 210. For example, the item indicator 210 may include an item identifier, webpage identifier, item name, or other data indicative of a pair of eyeglasses available for purchase using an online store. Based on the item indicator 210, the request module 212 may determine a 3D model 140 that represents the associated item.

A model mapping module 214 associated with the request processing server(s) 208 may generate a model mapping determination 216 based on the input image 204 and the 3D model 140. For example, the model mapping module 214 may include one or more of computer vision, segmentation, or other image recognition or image processing algorithms that is trained to determine portions of the input image 204 (e.g., sets of pixels) that correspond to parts of the body of a depicted individual. The model mapping module 214 may also determine portions of the 3D model 140 that correspond to the portions of the body of the individual. For example, the mapping module 214 may determine pixels within the input image 204 that correspond to the location of ears, eyes, and nose of the depicted individual. Portions of the 3D model 140 that correspond to the temples, lenses, and nose bridge of the depicted eyeglasses may then be determined and positioned relative to the corresponding portions of the body of the individual to generate the output image 202. In other implementations, the 3D model 140 may include data indicative of portions of the 3D model 140 that correspond to one or more parts of the body of an individual and use of the mapping module 214 to determine these portions of the 3D model 140 may be omitted.

An output module 218 associated with the request processing server(s) 208 may generate the output image 202 based on the input image 204, the 3D model 140, and the model mapping determination 216. Specifically, based on the orientation of the portions of the body determined by the model mapping module 214 and the location of those portions of the body within the input image 204, the output module 218 may determine an orientation and position of the 3D model 140 that corresponds to the location(s) and orientation(s) of the portions of the body. The output image 202 may therefore be generated to include the 3D model 140 presented in association with the body of the individual, such as to depict the individual wearing the item represented by the 3D model 140. As a result, the appearance of the user, or another individual, wearing or otherwise associated with an item represented by a 3D model 140 may be used to facilitate examination of items, purchase decisions, and so forth. In some implementations, the process described herein may be performed continuously. For example, as a user moves, a camera associated with the user device may continue to acquire additional input images 204, and an output image 202 that presents the item in association with the body of the user may continue to be generated as the user moves.

Figure 3:
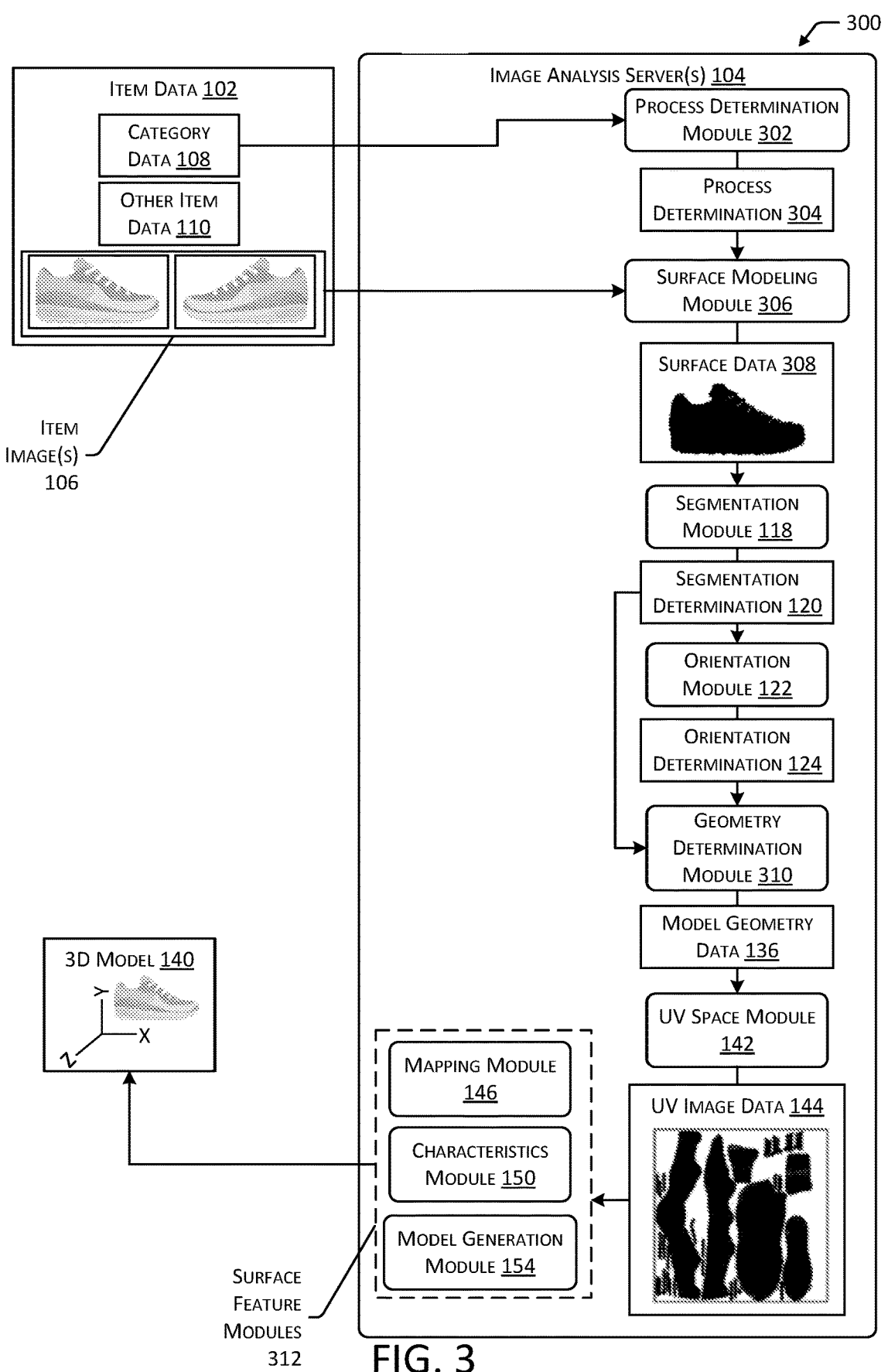
FIG. 3 is a diagram depicting an implementation of a system for determining a three-dimensional model that represents an item having an irregular shape, based on one or more images of the item.

FIG. 3 is a diagram 300 depicting an implementation of a system for determining a three-dimensional model 140 that represents an item having an irregular shape, based on one or more images of the item. For example, while FIGS. 1A and 1B describe determining a three-dimensional model 140 that represents an item having a generally rigid, geometric shape (e.g., a pair of eyeglasses), FIG. 3 depicts item images 106 that represent a pair of shoes, which may have an irregular, and in some cases deformable shape.

As described with regard to FIGS. 1A and 1B, one or more image analysis servers 104 may receive item data 102, which may include one or more item images 106 that depict an item, category data 108 indicative of a type or category associated with the depicted item, and in some cases, other item data 110 such as titles, brands or manufacturers, dimensions, materials, descriptions, prices, and so forth related to the item. The item images 106 may depict the item from various orientations or viewpoints, and in some cases may depict different variations of the item, such as different colors or textures.

A process determination module 302 associated with the image analysis server(s) 104 may generate a process determination 304 based on the category data 108. For example, in response to the category data 108 indicating an item category of "footwear", which may have an irregular shape for which bounding box data 116 may not exist, the process determination 304 may cause use of one or more surface modeling algorithms to determine portions of the item image(s) 106 that includes the represented item.

Continuing the example, a surface modeling module 306 associated with the image analysis server(s) 104 may determine surface data 308 that represents a surface topology associated with the item. One or more surface modeling algorithms may be used, which in some implementations may utilize implicit functions such as signed distance fields (SDF), unsigned distance fields (UDF), occupancy fields, and so forth. In some implementations, a lattice deformation cage mesh may be generated that contains portions of the item image(s) 106 that are likely to include the item. For example, a lattice mesh may include a structured array of points having vertexes that may be positioned or moved to deform the mesh to more closely approximate the surface of the underlying item. The lattice mesh may be a "watertight" mesh that lacks holes, therefore having a clearly defined interior and exterior. (See, e.g., *A formal Definition of Watertight Meshes* by David Stutz, davidstutz.de, Jan. 24, 2018.)

After determining the surface data 308 based on the item image(s) 106, the segmentation module 118 may determine sets of pixels of the item image(s) 106 and surface data 308 that are likely to include the item, and the orientation module 122 may determine an orientation, point of view, or pose of a set of pixels within the item image(s) 106 or surface data 308 relative to a normal orientation Based on the segmentation determination 120 and orientation determination 124, a geometry determination module 310 may determine a mesh and model geometry data 136. For example, the geometry determination module 310 may use a marching cubes algorithm to extract a polygonal mesh from the surface represented by the surface data 308.

As described with regard to FIG. 1B, the UV space module 142 may determine UV image data 144 based on the model geometry data 136. The UV image data 144 may include a two-dimensional mesh or image that represents the parts of the item represented by the model geometry data 136. For example, each pixel of the UV image data 144 may map to a corresponding pixel of the model geometry data 136. The surface feature modules 312 described with regard to FIG. 1B may determine the three-dimensional model 140 based on the model geometry data 136 and the characteristics of the pixels of the item images 106 that correspond to the pixels of the UV image data 144. For example, the mapping module 146 may determine a mapping between pixels of the UV image data 144 and pixels of the item image(s) 106. Color values, texture values, or other characteristics of the pixels in the item image(s) 106 may then be associated with corresponding pixels of the UV image data 144. These pixel characteristics may then be associated with the 3D model 140. As described previously, the 3D model 140 may then be presented as output, enabling characteristics of the depicted item to be examined by manipulating the 3D model 104. Further, as described with regard to FIG. 2, the 3D model 140 may be used in combination with an input image 204 depicting a portion of an individual, to generate an output image 202 showing the item in association with the individual, such as by depicting the individual wearing the item.

FIG. 4 is a flow diagram 400 depicting an implementation of a method for determining a three-dimensional model 140 that represents an item based on images of the item and using the model to determine an output image 202 based on an input image 204 representing a user or other individual. At 402, images that depict an item may be accessed, and a category associated with the item may be determined. For example, one or more computing devices used to generate 3D models 140 based on item images 106 may access item data 102 stored in association with the computing device(s), request the item data 102 from another computing device, or receive the item data 102 from another computing device requesting generation of a 3D model 104. The item data 102 may include one or more item images 106, which may depict an item from various orientations, different variations of the item, and so forth. The item data 102 may also include category data 108 indicative of a category of the item, and other item data 110 that may include other characteristics of the item, such as a brand or manufacturer, item name, price, dimensions, materials, text describing the item, and so forth. In some implementations, a category of the item may be determined based at least in part on the item image(s) 106 or other item data 110, such as if a category for the item is not specified in category data 108.

At 404, if it is determined that the item category is associated with bounding box data 116, a set of bounding boxes that represent locations of portions of the item within the image(s) may be determined. For example, certain types of items may have generally rigid, geometric shapes. Continuing the example, a pair of eyeglasses, as described with regard to FIG. 1A, may have a shape defined by three bounding boxes: a first bounding box representing the front frame, lenses, and nose bridge, a second bounding box representing a right temple that is positioned at an end of the first bounding box and extends generally perpendicular to the first bounding box, and a third bounding box representing a left temple that is positioned at an opposite end of the first bounding box and extends generally perpendicular to the first bounding box in the same direction as the second bounding box. A location of a set of bounding boxes may be determined by fitting the bounding boxes that correspond to the item category to regions of the item image(s) 106 having pixel characteristics that correspond to characteristics of the item.

At 406, if it is determined that the item category is not associated with bounding box data 116, a surface modeling algorithm may be used to determine a surface topography of the item based on the images. In other implementations, an item category may be associated with an indication of a particular surface modeling algorithm or an indication that one or more surface modeling algorithms are suitable for use determining portions of the item image(s) 106 that include the item. One or more surface modeling algorithms may be used to determine surface data 308 that represents a surface topology associated with the item. In some implementations, surface modeling algorithms may utilize implicit functions such as signed distance fields (SDF), unsigned distance fields (UDF), occupancy fields, and so forth. In some implementations, a lattice deformation cage mesh may be generated that contains portions of the item image(s) 106 that are likely to include the item. For example, a lattice mesh may include a structured array of points having vertexes that may be positioned or moved to deform the mesh to more closely approximate the surface of the underlying item. (See, e.g., Deformation Cage by Mason Smigel, masonsmigel.com, Jan. 7, 2023.) The lattice mesh may be a watertight mesh that lacks holes, therefore having a clearly defined interior and exterior.

At 408, a segmentation process may be used to determine sets of pixels that correspond to portions of the item. For example, one or more segmentation networks may determine characteristics of pixels in bounding boxes, or in the surface data 308 determined using a surface modeling algorithm. Continuing the example, the segmentation network may utilize one or more computer vision algorithms or one or more machine learning networks trained to partition an item image 106. Based on the color, intensity, texture, or other characteristics of particular pixels, edges and boundaries of objects may be determined. For example a segmentation network may determine a label for each pixel based on the characteristics of the pixels, and pixels having the same labels or labels that represent characteristics within a threshold value of one another may be classified within the same segment.

At 410, if the item category is associated with bounding box data 116 (as described at 404), masks may be generated based on the determined sets of pixels and the orientations of the sets of pixels relative to a selected orientation. For example, the orientation, point of view, or pose of a set of pixels represented by the segmentation determination 120 relative to a selected orientation (e.g., a normal orientation), may affect the generation of a mask having the selected orientation, such an orthogonal orientation. In some implementations, a surface normal estimation may be used to predict the surface orientation of objects present in an item image 106 based on characteristics of the pixels of the image and the segmentation determination 120. A difference in orientation or viewpoint between a set of pixels determined based on the item image 106 and the selected orientation may be used to generate a mask based on the segmentation determination 120. In some implementations, a mask may be generated for each bounding box associated with an item, each segment determined using a segmentation network, and so forth. In some implementations, a mask may be represented as a convolution matrix that may be used for edge detection or other operations associated with an item image 106.

At 412, meshes may be generated from the silhouette of the masks. A mesh may be generated from the silhouette of a mask, such as through use of Delaunay triangulation or another technique. For example, Delaunay triangulation determines, for a given set of points, a set of triangles that maximizes the minimum of all angles of the triangles when no point of the set of points is inside the circumcircle of any triangle.

At 414, a constructive solid geometry (CSG) algorithm may be used to solidify the meshes with equal depth. For example, the meshes generated at 412 may include planar meshes, and use of a CSG algorithm to add depth may generate solids based on the meshes. The solids may then be used to determine model geometry data 136 that represents the item based on Boolean relationships, or other types of relationships, between the solids.

For example, at 416, a three-dimensional model 140 for the item may be determined based on the Boolean intersections of the solidified meshes. The combination of solids generated using the CSG algorithm may result in certain portions of the solids overlapping (e.g., Boolean intersections), which may be used to determine model geometry data 136 representing the shape of the item.

If the item category is not associated with bounding box data (as described at 406), a mesh and three-dimensional model may be determined based on the surface topography (determined at 406) and a marching cubes algorithm. In other implementations, other geometry determination algorithms may be used.

At 418, a two-dimensional mesh may be determined based on the UV coordinates of the three-dimensional model 140. For example, the two-dimensional mesh may represent the UV or texture space of the 3D model 140. Continuing the example, the two-dimensional mesh may represent the parts of the item represented by the 3D model 140, as described with regard to FIGS. 1B and 3. Each pixel that corresponds to a portion of the item in the two-dimensional mesh may therefore map to a corresponding pixel of the 3D model 140.

At 420, a mapping between pixels of the two-dimensional mesh and corresponding pixels of the image(s) of the item may be determined. For example, the orientation associated with an item image 106 relative to an orientation of the model geometry data 136 or pixels in the two-dimensional mesh may be determined. Based on a difference in orientation, a correspondence between portions of the two-dimensional mesh and portions of the item images 106 may be determined.

At 422, color and texture values of the pixels of the images of the item may be associated with corresponding pixels of the two-dimensional mesh, then the color and texture values may be associated with the three-dimensional model 140. For example, characteristics data 152 that represents characteristics of the pixels (e.g., color, texture, other visible characteristics) of the item image(s) 106 may be determined. Based on the determined mappings between the item image(s) 106 and the two-dimensional mesh, and between the two-dimensional mesh and the 3D model 140, the pixels of the 3D model 140 may be associated with color or texture values based on the characteristics data 152 representing pixel characteristics of the item images 106, and mapping data 148 that associates pixels of the item image(s) 106 with corresponding pixels of the two-dimensional mesh. For example, colors and textures of the item image(s) 106 may be projected to corresponding pixels of the two-dimensional mesh, which may in turn be used to provide the 3D model 140 with colors and textures of the item image(s) 106.

At 424, an input image 204 depicting a user may be received. As described with regard to FIG. 2, an input image 204 may be associated with an item indicator 210 indicative of a particular item or interface that may be used to determine a 3D model 140 associated with an item. As such, the input image 204 may constitute a request for generation of an output image 202 that depicts the user in the input image 204 in association with an item. The output image 202 may be generated based in part on the 3D model 140.

At 426, an output image 202 that shows the item in association with the user may be determined based on a mapping between pixels of the input image 204 and pixels of the three-dimensional model 140. For example, portions of the input image 204 that correspond to portions of the body of the user, such as a head or foot, may be determined using one or more segmentation, computer vision, or image analysis techniques. Portions of the 3D model 140 that are intended to be positioned proximate to the portions of the body of the user depicted in the input image 204 may also be determined, or data indicative of the pixels corresponding to these portions may be stored in association with the 3D model 140. For example, portions of a 3D model 140 that represents a pair of eyeglasses may include pixels that correspond to the temples, lenses, and nose bridge. These portions may be positioned relative to corresponding portions of the head of the user depicted in the input image 204, such as pixels determined to correspond to the location of the ears and nose of the user, to generate the output image 202.

Figure 5:
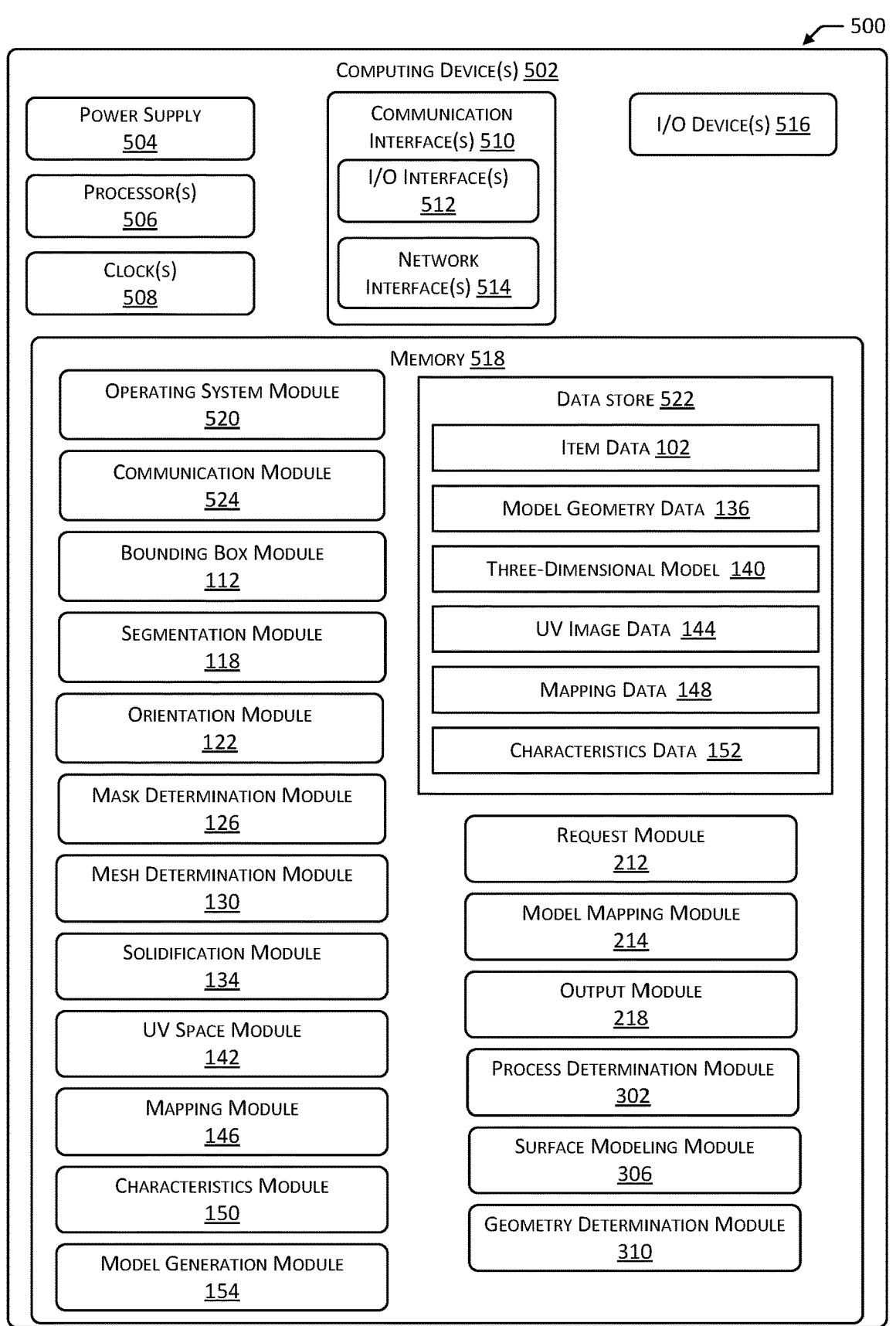
FIG. 5 is a block diagram depicting an implementation of a computing device within the present disclosure.

FIG. 5 is a block diagram 500 depicting an implementation of a computing device 502 within the present disclosure. The computing device 502 may include one or more image analysis servers 104, as described with regard to FIGS. 1A and 1B. However, in some implementations, one or more request processing servers 208 or other computing devices, such as user devices or other computing devices that communicate with the image analysis server(s) 104 may perform at least a portion of the functions described herein. As such, while FIG. 5 depicts a single block diagram 500, the depicted computing device 502 may include any number of computing devices of similar or different types.

One or more power supplies 504 may be configured to provide electrical power suitable for operating the components of the computing device 502. In some implementations, the power supply 504 may include a rechargeable battery, fuel cell, photovoltaic cell, power conditioning circuitry, and so forth.

The computing device 502 may include one or more hardware processor(s) 506 (processors) configured to execute one or more stored instructions. The processor(s) 506 may include one or more cores. One or more clock(s) 508 may provide information indicative of date, time, ticks, and so forth. For example, the processor(s) 506 may use data from the clock 508 to generate a timestamp, trigger a preprogrammed action, and so forth.

The computing device 502 may include one or more communication interfaces 510, such as input/output (I/O) interfaces 512, network interfaces 514, and so forth. The communication interfaces 510 may enable the computing device 502, or components of the computing device 502, to communicate with other computing devices 502 or components of the other computing devices 502. The I/O interfaces 512 may include interfaces such as Inter-Integrated Circuit (I2C), Serial Peripheral Interface bus (SPI), Universal Serial Bus (USB) as promulgated by the USB Implementers Forum, RS-232, and so forth.

The I/O interface(s) 512 may couple to one or more I/O devices 516. The I/O devices 516 may include any manner of input devices or output devices associated with the computing device 502. For example, I/O devices 516 may include touch sensors, displays, touch sensors integrated with displays (e.g., touchscreen displays), keyboards, mouse devices, microphones, image sensors, cameras, scanners, speakers or other types of audio output devices, haptic devices, printers, and so forth. In some implementations, the I/O devices 516 may be physically incorporated with the computing device 502. In other implementations, I/O devices 516 may be externally placed.

The network interfaces 514 may be configured to provide communications between the computing device 502 and other devices, such as the I/O devices 516, routers, access points, and so forth. The network interfaces 514 may include devices configured to couple to one or more networks including local area networks (LANs), wireless LANs (WLANs), wide area networks (WANs), wireless WANs, and so forth. For example, the network interfaces 514 may include devices compatible with Ethernet, Wi-Fi, Bluetooth, ZigBee, Z-Wave, 3G, 4G, 5G, LTE, and so forth.

The computing device 502 may include one or more buses or other internal communications hardware or software that allows for the transfer of data between the various modules and components of the computing device 502.

As shown in FIG. 5, the computing device 502 may include one or more memories 518. The memory 518 may include one or more computer-readable storage media (CRSM). The CRSM may be any one or more of an electronic storage medium, a magnetic storage medium, an optical storage medium, a quantum storage medium, a mechanical computer storage medium, and so forth. The memory 518 may provide storage of computer-readable instructions, data structures, program modules, and other data for the operation of the computing device 502. A few example modules are shown stored in the memory 518, although the same functionality may alternatively be implemented in hardware, firmware, or as a system on a chip (SoC).

The memory 518 may include one or more operating system (OS) modules 520. The OS module 520 may be configured to manage hardware resource devices such as the I/O interfaces 512, the network interfaces 514, the I/O devices 516, and to provide various services to applications or modules executing on the processors 506. The OS module 520 may implement a variant of the FreeBSD operating system as promulgated by the FreeBSD Project; UNIX or a UNIX-like operating system; a variation of the Linux operating system as promulgated by Linus Torvalds; the Windows operating system from Microsoft Corporation of Redmond, Washington, USA; or other operating systems.

One or more data stores 522 and one or more of the following modules may also be associated with the memory 518. The modules may be executed as foreground applications, background tasks, daemons, and so forth. The data store(s) 522 may use a flat file, database, linked list, tree, executable code, script, or other data structure to store information. In some implementations, the data store(s) 522 or a portion of the data store(s) 522 may be distributed across one or more other devices including other computing devices, network attached storage devices, and so forth.

A communication module 524 may be configured to establish communications with one or more other computing devices 502. Communications may be authenticated, encrypted, and so forth.

The memory 518 may also store the bounding box module 112. The bounding box module 112 may generate bounding box determinations 114 indicative of bounding boxes or other regions of item images 106 that are likely to include a depicted item. For example, the bounding box module 112 may access bounding box data 116 that associates the category of the item with one or more bounding box determinations 114. The bounding box module 112 may include one or more machine learning algorithms trained to determine a set of bounding boxes that correspond to the characteristics of pixels in an item image 106, such that the bounding box determination 114 for that item image 106 indicates a number and placement of bounding boxes that each contain a portion of the represented item.

The memory 518 may additionally store the segmentation module 118. The segmentation module 118 may generate a segmentation determination 120 based on characteristics of pixels within bounding boxes or other regions of an item image 106. The segmentation determination 120 may indicate one or more sets of pixels that are likely to be associated with the same portion of the item represented in the item image(s) 106. For example, the segmentation module 118 may include one or more computer vision algorithms or one or more machine learning networks trained to partition an item image 106 into multiple regions or objects (e.g., sets of pixels) that correspond to particular objects, backgrounds, and so forth. Continuing the example, based on the color, intensity, texture, or other characteristics of particular pixels, edges and boundaries of objects may be determined. In some implementations, the segmentation module 118 may determine a label for each pixel within a bounding box based on characteristics of the pixels, and pixels having the same labels or labels that represent characteristics within a threshold value of one another may be classified within the same segment.

The memory 518 may store the orientation module 122. The orientation module 122 may generate one or more orientation determinations 124 indicative of an orientation, point of view, or pose of a set of pixels, portions of a 3D model 140, and so forth. For example, the orientation module 122 may include one or more machine learning systems trained to generate a surface normal estimation to predict the surface orientation of objects present in an item image 106 based on characteristics of the pixels of the image. A difference between a determined orientation within an image and a selected orientation may be used when generating masks, output images 202, and so forth.

The memory 518 may also store the mask determination module 126. The mask determination module 126 may determine mask data 128 representing one or more masks based on sets of pixels determined using the segmentation module 118 and an orientation determined using the orientation module 122. In some implementations, a mask may be generated for each bounding box associated with an item image 106. In some cases, masks may be provided with a selected orientation, such as frontal, side, or top. Masks may be used to determine the boundaries of items or portions of an item within the item image 106. In some implementations, a mask may be represented as a convolution matrix that may be used for edge detection or other operations associated with an item image 106.

The memory 518 may store the mesh determination module 130. The mesh determination module 130 may determine mesh data 132 based on one or more masks, portions of a 3D model 140, and so forth. For example, a mesh may be generated from the silhouette of a mask, such as through use of Delaunay triangulation or another technique. Continuing the example, Delaunay triangulation determines, for a given set of points, a set of triangles that maximizes the minimum of all angles of the triangles when no point of the set of points is inside the circumcircle of any triangle.

The memory 518 may additionally store the solidification module 134. The solidification module 134 may use a constructive solid geometry (CSG) algorithm or other technique to add depth to the planar meshes represented by the mesh data 132, then determine model geometry data 136 based on the solidified meshes. For example, the CSG algorithm may be used to add an equal amount of depth to a set of meshes. The Boolean intersections of the combination of the solidified meshes may be used to determine model geometry data 136 for a 3D model 140. For example, the model geometry data 136 may represent the determined shape of the item depicted in one or more item images 106. Continuing the example, a CSG algorithm may be used to convert the planer meshes represented by the mesh data 132 into geometric primitives. The combination of these primitives may result in certain portions of the primitives overlapping (e.g., a Boolean intersection), which may be used to determine model geometry data 136.

The memory 518 may store the UV space module 142. The UV space module 142 may determine a two-dimensional image, such as a mesh, that represents the UV or texture space of a 3D model 140. For example, UV image data 144, may represent the parts of an item represented by the 3D model 140. Each pixel that corresponds to a portion of the item in the UV Image data 144 may map to a corresponding pixel of the 3D model 140.

The memory 518 may also store the mapping module 146. The mapping module 146 may determine mappings between pixels of images, meshes, and models. For example, the mapping module 146 may determine a mapping between pixels of the UV image data 144 and corresponding pixels of the item images 106. For example, the mapping module 146 may determine the orientation associated with an item image 106 relative to an orientation of a 3D model 140, such that a correspondence between portions of the UV image data 144 and portions of the item images 106 may be determined. The mapping module 146 may also determine mappings between portions of a 3D model 140 and portions of an input image 204, such as when generating an output image 202 that depicts an item represented by the 3D model 104 in association with an individual depicted in the input image 204.

The memory 518 may additionally store the characteristics module 150. The characteristics module 150 may determine characteristics data 152 based on pixels of the item image(s) 106. For example, the characteristics data 152 may represent characteristics of one or more pixels of the item image(s) 106, such as color values, texture values, intensity, or other visible characteristics of the pixels. Characteristics data 152 may be used to determine sets of pixels associated with particular segments or masks, to determine color or texture values to associate with portions of a 3D model 140, and so forth.

The memory 518 may store the model generation module 154. The model generation module 154 may, based on mapping data 148 and characteristics data 152, generate a 3D model 140. The 3D model 140 may include geometry determined based on use of the bounding box module 112, segmentation module 118, orientation module 122, mask determination module 126, mesh determination module 130, and solidification module 134. For example, the model geometry data 136 determined using the solidification module 134 may be associated with the color or texture values associated with the characteristics data 152, based on mapping data 148 that associates pixels of the item image(s) 106 with corresponding pixels of the UV image data 144, to generate the 3D model 140.

The memory 518 may also store the request module 212. The request module 212 may receive request data 206 indicative of an item and determine a 3D model 140 that corresponds to the item.

The memory 518 may additionally store the model mapping module 214. The model mapping module 214 may generate a model mapping determination 216 based on an input image 204 and a 3D model 140. For example, the model mapping module 214 may include one or more computer vision, segmentation, or other image recognition or image processing algorithms that are trained to determine portions of the input image 204 (e.g., sets of pixels) that correspond to parts of the body of a depicted individual. The model mapping module 214 may also determine portions of the 3D model 140 that correspond to the portions of the body of the individual depicted in the input image 204, or the portions of the 3D model 140 may be indicated in data associated with the 3D model 140. The model mapping determination 216 may be used to generate an output image 202 that depicts portions of the item represented by the 3D model 140 proximate to or associated with portions of the body of the individual depicted in the input image 204.

The memory 518 may store the output module 218. The output module 218 may generate an output image 202 based on an input image 204, a 3D model 140, and a model mapping determination 216 from the model mapping module 214. For example, based on the orientation of the portions of the body determined by the model mapping module 214 and the location of those portions of the body within the input image 204, the output module 218 may determine an orientation and position of the 3D model 140 that corresponds to the location(s) and orientation(s) of the portions of the body depicted. The output image 202 may therefore present the item represented by the 3D model 140 presented in association with the body of the individual, such as to depict the individual wearing the item represented by the 3D model 140.

The memory 518 may also store the process determination module 302. The process determination module 302 may determine whether bounding box data 116 for a particular item or category of item exists, or whether a category associated with an item represented by an item image 106 corresponds to use of the bounding box module 112 or the surface modeling module 306. For example, in response to category data 108 indicating an item category associated with an irregular shape for which bounding box data 116 may not exist, the process determination 304 may cause use of one or more surface modeling algorithms to determine portions of the item image(s) 106 that include the represented item.

The memory 518 may additionally store the surface modeling module 306. The surface modeling module 306 may determine surface data 308 that represents a surface topology associated with an item depicted in an item image 106. The surface modeling module 306 may use one or more surface modeling algorithms, which in some implementations may utilize implicit functions such as signed distance fields (SDF), unsigned distance fields (UDF), occupancy fields, and so forth. In some implementations, a lattice deformation cage mesh may be generated that contains portions of the item image(s) 106 that are likely to include the item. For example, a lattice mesh may include a structured array of points having vertexes that may be positioned or moved to deform the mesh to more closely approximate the surface of the underlying item. The lattice mesh may be a "watertight" mesh that lacks holes, therefore having a clearly defined interior and exterior.

The memory 518 may store the geometry determination module 310. The geometry determination module 310 may be used to determine a mesh and a three-dimensional model 140 based on surface data 308 associated with an item. In one implementation, the geometry determination module 310 may use a marching cubes algorithm, to extract a polygonal mesh of the isosurface associated with the three-dimensional field represented by the surface data 308.

Other modules may also be present in the memory 518. For example, other modules may include permission or authorization modules for sending data to or receiving data from the computing device 502, for modifying configurations or settings, and so forth. Other modules may also include encryption modules to encrypt and decrypt communications between computing devices 502, authentication modules to authenticate communications sent or received by computing devices 502, user interface modules to generate interfaces for presenting output, receiving input from users, and so forth. Other modules may also include training modules for training various machine learning algorithms for estimating bounding boxes, segmenting images, generating masks and mappings, and so forth.

Other data within the data store(s) 522 may include configurations, settings, preferences, and default values associated with computing devices 502. Other data may also include encryption keys and schema, access credentials, and so forth. Other data may include various rules, algorithms, and thresholds for performance of various tasks. Other data may include training data and parameters for various machine learning networks.

The processes discussed in this disclosure may be implemented in hardware, software, or a combination thereof. In the context of software, the described operations represent computer-executable instructions stored on one or more computer-readable storage media that, when executed by one or more hardware processors, perform the recited operations. Generally, computer-executable instructions include routines, programs, objects, components, data structures, and the like that perform particular functions or implement particular abstract data types. Those having ordinary skill in the art will readily recognize that certain steps or operations illustrated in the figures above may be eliminated, combined, or performed in an alternate order. Any steps or operations may be performed serially or in parallel. Furthermore, the order in which the operations are described is not intended to be construed as a limitation.

Embodiments may be provided as a software program or computer program product including a non-transitory computer-readable storage medium having stored thereon instructions (in compressed or uncompressed form) that may be used to program a computer (or other electronic device) to perform processes or methods described in this disclosure. The computer-readable storage medium may be one or more of an electronic storage medium, a magnetic storage medium, an optical storage medium, a quantum storage medium, and so forth. For example, the computer-readable storage media may include, but is not limited to, hard drives, optical disks, read-only memories (ROMs), random access memories (RAMs), erasable programmable ROMs (EPROMs), electrically erasable programmable ROMs (EEPROMs), flash memory, magnetic or optical cards, solid-state memory devices, or other types of physical media suitable for storing electronic instructions. Further, embodiments may also be provided as a computer program product including a transitory machine-readable signal (in compressed or uncompressed form). Examples of transitory machine-readable signals, whether modulated using a carrier or unmodulated, include, but are not limited to, signals that a computer system or machine hosting or running a computer program can be configured to access, including signals transferred by one or more networks. For example, the transitory machine-readable signal may comprise transmission of software by the Internet.

Separate instances of these programs can be executed on or distributed across any number of separate computer systems. Although certain steps have been described as being performed by certain devices, software programs, processes, or entities, this need not be the case, and a variety of alternative implementations will be understood by those having ordinary skill in the art.

Additionally, those having ordinary skill in the art will readily recognize that the techniques described above can be utilized in a variety of devices, environments, and situations. Although the subject matter has been described in language specific to structural features or methodological acts, it is to be understood that the subject matter defined in the appended claims is not necessarily limited to the specific features or acts described. Rather, the specific features and acts are disclosed as exemplary forms of implementing the claims.

What is claimed is:

1. A system comprising:

one or more non-transitory memories storing computer-executable instructions; and one or more hardware processors to execute the computer-executable instructions to:

access a plurality of images that depict an item available in a catalog, the plurality of images including at least a first image and a second image, wherein the plurality of images are associated with previously stored category data indicative of a category of the item;

access previously stored bounding box data associated with the category, wherein the bounding box data includes a set of bounding boxes that represent one or more locations of a portion of the item;

based on correspondence between the first image and the bounding box data, determine at least a first bounding box that represents a first location of a first portion of the item within the first image, and a second bounding box that represents a second location of a second portion of the item within the first image;

based on correspondence between the second image and the bounding box data, determine at least a third bounding box that represents a third location of the first portion of the item within the second image, and a fourth bounding box that represents a fourth location of the second portion of the item within the second image;

determine a first mask based on characteristics of a first set of pixels within the first bounding box and a second set of pixels within the second bounding box;

determine a second mask based on characteristics of a third set of pixels within the third bounding box and a fourth set of pixels within the fourth bounding box;

use a constructive solid geometry algorithm to determine a three-dimensional model based on the first mask and the second mask, wherein the three-dimensional model represents the item;

use a mapping algorithm to determine a two-dimensional image based on the three-dimensional model;

determine a first mapping between one or more first pixels of the first image and one or more second pixels of the two-dimensional image;

determine a second mapping between one or more third pixels of the second image and one or more fourth pixels of the two-dimensional image;

associate a first set of values of the one or more first pixels with the one or more second pixels based on the first mapping, wherein the first set of values represents one or more of color or texture of the one or more first pixels;

associate a second set of values of the one or more third pixels with the one or more fourth pixels based on the second mapping, wherein the second set of values represents one or more of color or texture of the one or more third pixels; and associate one or more values that represent one or more of color or texture with the three-dimensional model, based on the two-dimensional image, the first set of values, and the second set of values.

2. The system of claim 1, further comprising computer-executable instructions to:

receive an input image that depicts at least a portion of a user;

determine a fifth set of pixels of the input image that represent a portion of a body of the user;

determine a third mapping between a portion of the three-dimensional model and the fifth set of pixels; and based on the third mapping, generate an output image that depicts the item in association with the body of the user.

3. The system of claim 1, further comprising computer-executable instructions to:

determine that the category of the item is associated with an irregular shape; and in response to determination of the category associated with the item, use a surface modeling algorithm to determine a surface topology associated with at least a portion of the first mask.

4. A system comprising:

one or more non-transitory memories storing computer-executable instructions; and one or more hardware processors to execute the computer-executable instructions to:

access a first image of an item available in a catalog;

determine a first set of pixels of the first image that represent a first portion of the item;

determine a second set of pixels of the first image that represent a second portion of the item;

determine a first mask based on the first set of pixels and a second mask based on the second set of pixels;

determine a first solidified mesh based on the first mask, using a constructive solid geometry algorithm;

determine a second solidified mesh based on the second mask, using the constructive solid geometry algorithm;

determine a three-dimensional model based on a Boolean operation using the first solidified mesh and the second solidified mesh;

based on the three-dimensional model, determine a second image that includes a plurality of pixels, and a first mapping that associates each pixel of the plurality of pixels with a corresponding pixel of the three-dimensional model;

determine a second mapping between one or more first pixels of the first image and one or more second pixels of the second image;

associate a first set of values of the one or more first pixels with the one or more second pixels based on the second mapping, wherein the first set of values represents one or more of color or texture of the one or more first pixels; and associate the first set of values with one or more third pixels of the three-dimensional model based on the first mapping.

5. The system of claim 4, wherein the first image depicts the item having a first orientation, the system further comprising computer-executable instructions to:

access a third image that depicts the item, wherein the third image depicts the item from a second orientation;

determine a third set of pixels of the third image that represent the first portion of the item; and determine a fourth set of pixels of the third image that represent the second portion of the item;

wherein the first mask is further determined based on the third set of pixels, and the second mask is further determined based on the fourth set of pixels.

6. The system of claim 4, further comprising computer-executable instructions to:

access a previously stored category associated with one or more of the first image or the item; and access previously stored bounding box data associated with the category, wherein the bounding box data includes a set of bounding boxes that represent one or more locations within the first image of the first portion of the item relative to one or more locations within the first image of the second portion of the item;

wherein the first set of pixels and the second set of pixels are determined based on the bounding box data, the first image, and a machine learning algorithm that is trained to determine portions of an image that correspond to locations of bounding boxes based on characteristics of the pixels.

7. The system of claim 4, wherein the first image comprises a second plurality of pixels, the system further comprising computer-executable instructions to:

determine one or more pixel characteristics for each pixel of the second plurality of pixels;

wherein the first set of pixels is determined based on a segmentation algorithm and a first subset of the one or more pixel characteristics associated with the first set of pixels, and wherein the second set of pixels is determined based on the segmentation algorithm and a second subset of the one or more pixel characteristics associated with the second set of pixels.

8. The system of claim 4, further comprising computer-executable instructions to:

determine a first orientation of the first portion of the item, relative to a normal orientation, based on the first set of pixels using a surface normal algorithm, wherein the first mask has the normal orientation and is generated based on a first difference between the first orientation and the normal orientation; and determine a second orientation of the second portion of the item, relative to the normal orientation, based on the second set of pixels using the surface normal algorithm, wherein the second mask is generated based on a second difference between the second orientation and the normal orientation.

9. The system of claim 4, wherein the Boolean operation comprises a Boolean intersection between the first solidified mesh and the second solidified mesh.

10. The system of claim 4, wherein the three-dimensional model is further determined based on one or more of: a signed distance field, an unsigned distance field, a marching cubes algorithm, or an occupancy field.

11. The system of claim 4, further comprising computer-executable instructions to:
determine a first orientation of the item associated with the first image;
determine a second orientation associated with one or more of the three-dimensional model or the item associated with the second image; and
determine a difference between the first orientation and the second orientation;
wherein the second mapping between the one or more first pixels of the first image and the one or more second pixels of the second image is determined based on the difference between the first orientation and the second orientation.

12. The system of claim 4, further comprising computer-executable instructions to:
determine a plurality of vertices associated with the three-dimensional model; and
determine the second image by associating each vertex of the plurality of vertices with a corresponding UV coordinate in the second image.

13. The system of claim 4, further comprising computer-executable instructions to:
receive an input image that depicts a user;
determine a third set of pixels that represent a portion of a body of the user in the input image;
determine a third mapping between a portion of the three-dimensional model and the third set of pixels; and
based on the third mapping, generate an output image that depicts the item in association with the body of the user.

14. A system comprising:
one or more non-transitory memories storing computer-executable instructions; and
one or more hardware processors to execute the computer-executable instructions to:
access a first image of an item available in a catalog;
determine a first set of pixels of the first image that represent at least a first portion of the item;
determine a first mask based on the first set of pixels;
determine a first solidified mesh based on the first mask, using a constructive solid geometry algorithm;
determine a three-dimensional model based on the first solidified mesh;
determine a second image based on the three-dimensional model, wherein the second image represents at least a first portion and a second portion of the three-dimensional model;
determine a first mapping between one or more first pixels of the first image and one or more second pixels of the second image and a second mapping between one or more third pixels of the second image and one or more fourth pixels of the three-dimensional model; and
associate a first set of values of the one or more first pixels with the one or more second pixels based on the first mapping, wherein the first set of values represents one or more of color or texture of the one or more first pixels.

15. The system of claim 14, further comprising computer-executable instructions to:
receive an input image that depicts a user;
determine one or more fifth pixels of the input image that represent a portion of a body of the user;
determine a second mapping between one or more sixth pixels of the three-dimensional model and the one or more fifth pixels of the input image; and
based on the second mapping, generate an output image that depicts the item in association with the body of the user.

16. The system of claim 14, further comprising computer-executable instructions to:
determine a second set of pixels of the first image that represent a second portion of the item;
determine a second mask based on the second set of pixels; and
determine a second solidified mesh based on the second mask, using the constructive solid geometry algorithm;
wherein the three-dimensional model is further determined based on a Boolean intersection of the first solidified mesh and the second solidified mesh.

17. The system of claim 14, further comprising computer-executable instructions to:
determine a category associated with one or more of the first image or the item; and
determine bounding box data associated with the category, wherein the bounding box data includes at least one bounding box that represents one or more locations within the first image of the first portion of the item;
wherein the first mask is determined based on characteristics of a plurality of pixels within the bounding box, wherein the plurality of pixels includes the first set of pixels.

18. The system of claim 17, wherein the first image comprises a plurality of pixels, the system further comprising computer-executable instructions to:
determine one or more pixel characteristics for each pixel of the plurality of pixels of the bounding box;
wherein the first set of pixels is determined based on a segmentation algorithm and a first subset of the one or more pixel characteristics associated with the first set of pixels.

19. The system of claim 18, further comprising computer-executable instructions to:
determine a first orientation of the first set of pixels relative to a normal orientation using a surface normal algorithm, wherein the first mask has the normal orientation and is generated based on a first difference between the first orientation and the normal orientation.

20. The system of claim 14, further comprising computer-executable instructions to:
determine a category associated with one or more of the first image or the item;
determine that the category is associated with items having irregular geometry; and
in response to determination of the category, use a surface modeling algorithm to determine a surface topology associated with at least a portion of the first mask.

* * * * *